United States Patent [19]

Hewes

[11] 4,071,775

[45] Jan. 31, 1978

[54] CHARGE COUPLED DIFFERENTIAL AMPLIFIER FOR TRANSVERSAL FILTER

[75] Inventor: Charles Robert Hewes, Dallas, Tex.

[73] Assignee: Texas Instruments Incorporated, Dallas, Tex.

[21] Appl. No.: 672,939

[22] Filed: Apr. 2, 1976

[51] Int. Cl.² .................... G11C 19/28; H01L 29/78; H03H 7/28
[52] U.S. Cl. ................................ 307/221 D; 357/24; 333/70 T
[58] Field of Search ............. 357/24; 307/221 D, 304; 333/70 T

[56] References Cited

U.S. PATENT DOCUMENTS

| | | | |
|---|---|---|---|
| 3,851,096 | 11/1974 | Collins et al. | 357/24 |
| 3,908,182 | 9/1975 | Lampe et al. | 357/24 |
| 3,925,805 | 12/1975 | Erb | 357/24 |
| 3,965,368 | 6/1976 | Emmons | 357/24 |
| 3,986,198 | 10/1976 | Kosonocky | 357/24 |

OTHER PUBLICATIONS

Mohsen et al, "Noise Measurements in Charge-Coupled Devices," IEEE Trans. Electron Devices, vol. ED-22 (5/75), pp. 209-218.
Sequin, "Linearity of Electrical Charge Injection into Charge-Coupled Devices," IEEE J. Solid-State Circuits, vol. SC-10 (4/75), pp. 81-92.
Tompsett, "Surface Potential Equilibration Method of Setting Charge in Charge-Coupled Devices," IEEE Trans. Electron Devices, vol. ED-22 (6/75), pp. 305-309.
MacLennan, "Charge-Coupled Devices: Signal Processing", Wireless World (2/75), pp. 61-65.
Emmons et al., "Noise Measurements on the Floating Input for Charge-Coupled Devices," J. Applied Physics, vol. 45 (12/74), pp. 5303-5306.
Emmons et al., "A Low-Noise CCD Input with Reduced Sensitivity to Threshold Voltage," IEEE Int. Electron Device Meeting (12/74), Tech. Dig., pp. 233-235.
Emmons et al., "Anti-Aliasing Characteristics of the Floating Diffusion Input," Int. Conf. Application of CCD's, San Diego (10/75), Proc. pp. 361-368.
Emmons et al., "A CCD Multiplexer with Forty AC Coupled Inputs," Int. Conf. Application of CCD's, San Diego (10/75), Proc. pp. 43-52.

Primary Examiner—William D. Larkins
Assistant Examiner—Gene M. Munson
Attorney, Agent, or Firm—James T. Comfort; Charles J. Fassbender

[57] ABSTRACT

A charge coupled amplifier wherein an output voltage proportional to the difference between two input voltages is achieved through use of different value capacitances associated with the signal input and signal output structures of the amplifier. The input capacitance is defined in one embodiment using a doped substrate region beneath a biased electrode located between the signal input gates. In a modified structure, increased area input gate electrodes are used to define the input capacitance. A CCD transversal filter employing split electrode tap weighting which together with associated charge coupled input and output amplifiers form part of a single semiconductor chip.

15 Claims, 17 Drawing Figures

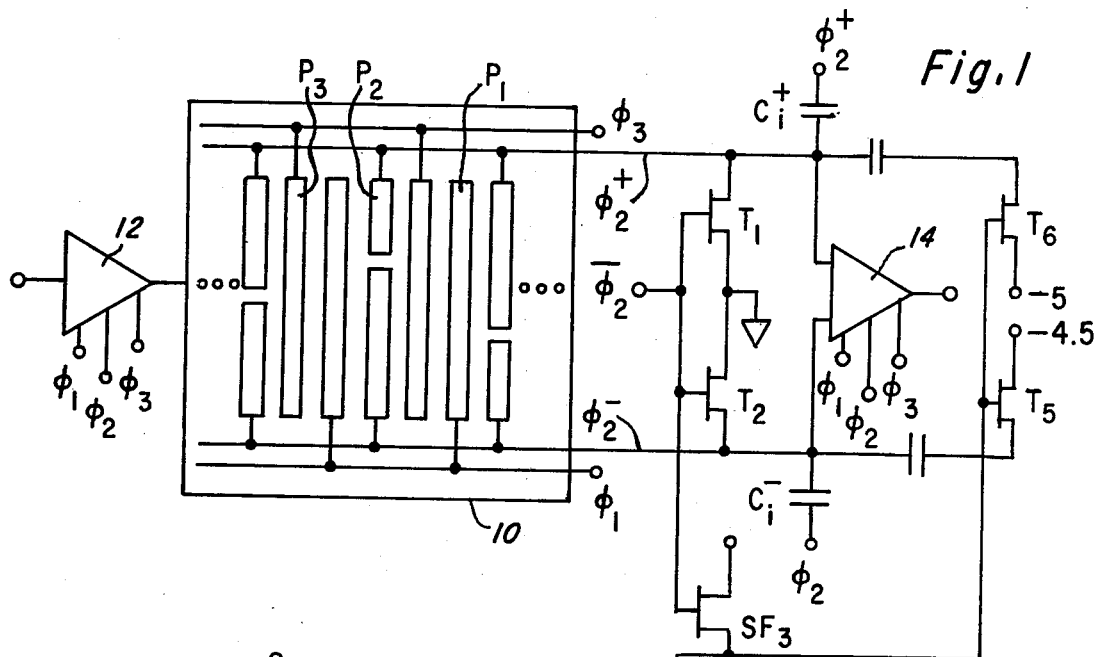
Fig.1
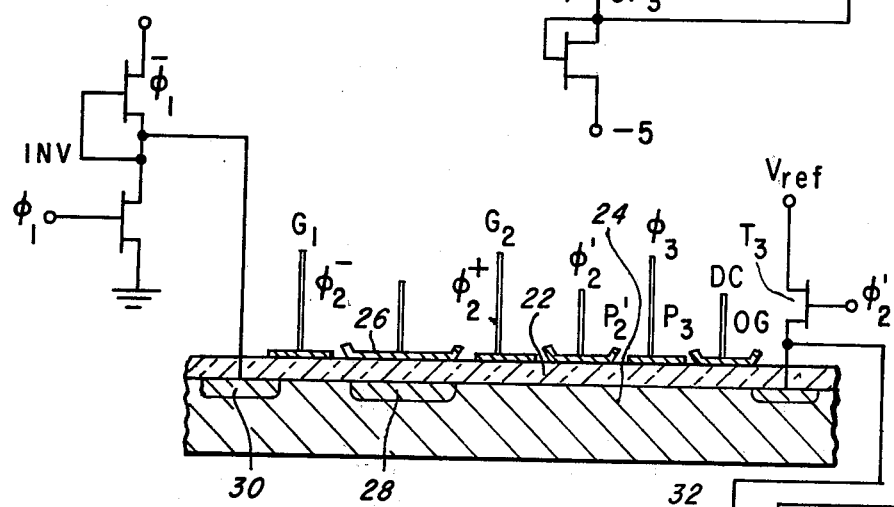
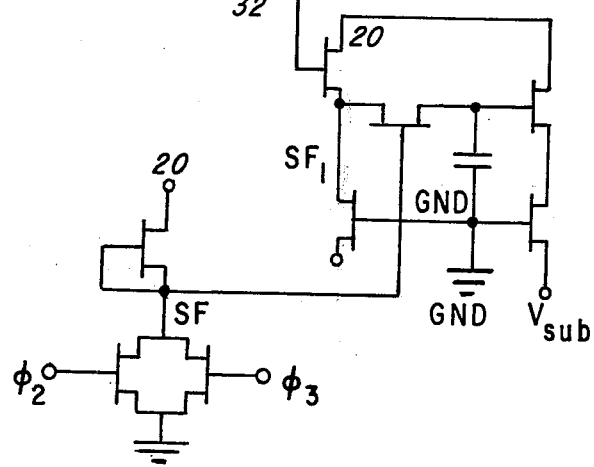
Fig.2

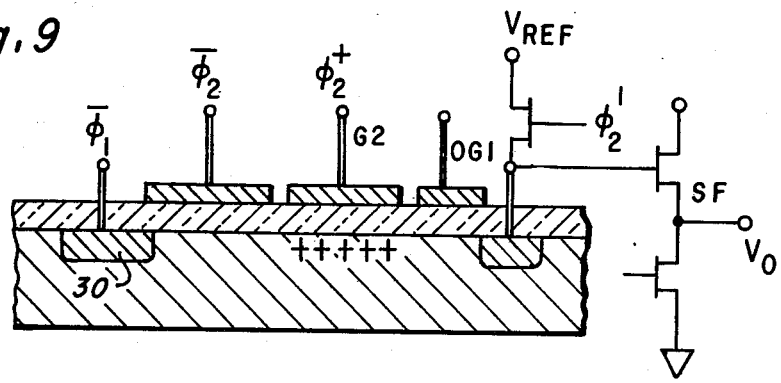
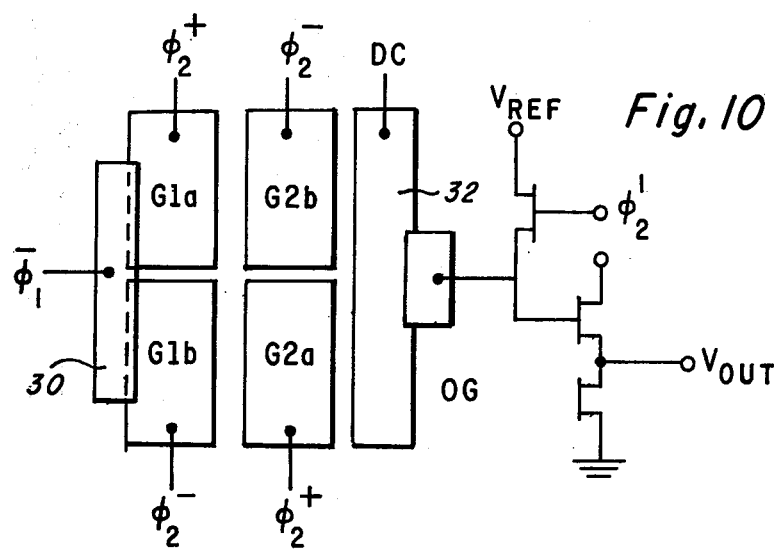
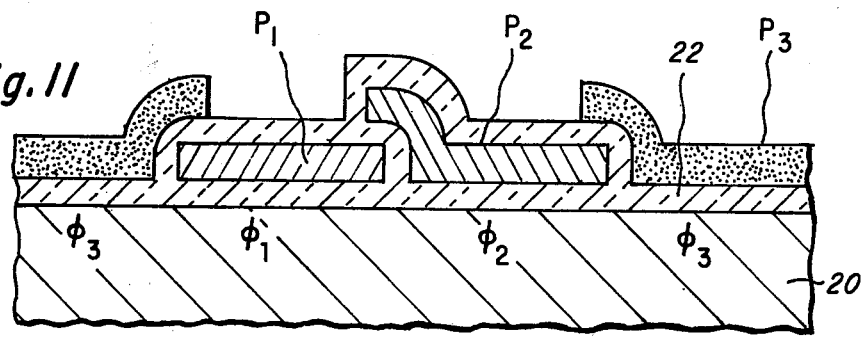

CHARGE COUPLED DIFFERENTIAL AMPLIFIER FOR TRANSVERSAL FILTER

This invention relates to charge coupled amplifiers and to structures incorporating such amplifiers. IGFET amplifiers are often used in conjunction with charge coupled device structures in order to provide signal voltage amplification. While such an approach typically permits use of the same fabrication techniques to be employed so that an integrated structure is possible, use of IGFET amplifiers is not always totally satisfactory. For example, the IGFET amplifiers may be subject to gain stability problems with temperature or supply voltage fluctuations that may require use of high gain feedback amplifiers. Furthermore, IGFET amplifiers increase the power supply requirements, particularly in the case of feedback stabilized amplifiers.

One particular area of interest for application of charge coupled device structures is the use of CCD transversal filters in applications such as spectral filtering, chirp Z transform, and correlators for radar and spread spectrum communication. The relative simplicity of the split electrode tap weight technique, for example as described by D. D. Buss, D. R. Collins, W. H. Brady and C. R. Reeves, "Transversal Filtering Using Charge Transfer Devices" IEEE J. Solid-State Circuits, SC-8, pages 134–146, April 1973, is a major reason for the versatility of CCD filters. However, the potential of such applications of CCD filters has not been realized to the extent possible, partially due to the complexity of external peripheral circuits required to operate the CCD, which have provided difficulties in integrating the required CCD support functions on the same chip as the CCD itself.

Use of the split electrode tap weight technique requires a differential voltage amplifier having a high common node rejection, high dynamic range, wide bandwidth and good linearity. Low power consumption is also desirable, particularly for low frequency operation where chip heating would increase dark count and limit the useful delay time in the filter.

It is an object of the present invention to provide a CCD structure capable of functioning as a differential voltage amplifier.

Accordingly, in one aspect, the invention provides a charge coupled differential amplifier comprising a semiconductor substrate having an insulating layer on one surface thereof. A charge carrier source is defined in the substrate. First and second serially disposed gate electrodes are defined on the insulating layer, the first gate electrode located adjacent the charge carrier source. The second gate electrode in conjunction with underlying regions of the insulating layer and semiconductor substrate defines a first predetermined capacitance C1. A further doped region in the substrate defines an output diode region having a another predetermined capacitance C3 substantially smaller than C1. First and second analog signal voltages are applied to the first and second gating electrodes and clock pulses are selectively applied to the charge carrier source to inject into the substrate a charge packet proportional to the difference $\Delta V$ between the signal voltages applied to the first and second gate electrodes for propagation to the output diode region. The voltage difference $\Delta V$ gives rise to an output voltage at the output diode proportional to $\Delta V \cdot C1/C3$.

Further in accordance with the invention, a transversal filter constructed with the split electrode tap weighting technique is integrated on the same semiconductor substrate as a differential amplifier according to the invention which provides the required output differential current integration function for the filter.

In one embodiment of an amplifier according to the invention, a diode region is located in the semiconductor substrate between the first and second gate electrodes, and is overlaid by an electrode to define the capacitance C2. The output voltage in this embodiment is proportional to $\Delta V \cdot C_{in}/C3$ where $C_{in} = C1 + C2$. In an alternative embodiment, the diode region may be omitted and the electrode may be biased to provide the required capacitance C2. In another alternative embodiment, the diode region and its associated electrode are utilized, the area of the second gate electrode being increased so that in conjunction with the underlying insulating layer and semiconductor substrate region it defines the required capacitance $C_{in}$. In operation of the amplifier structure, the first and second gate electrodes are differentially biased either from an external bias source or by use of a layer of immobile charge of appropriate polarity located beneath one of the gate electrodes which, for example, may be provided by implantation of ions into the insulating layer or into the surface of the semiconductor substrate at the desired location.

In a further aspect of the invention, a CCD transversal filter together with a charge coupled input amplifier and a charge coupled differential output amplifier as described above, all are integrated into the same semiconductor chip. A further level of complexity may readily be achieved by integrating a plurality of CCD transversal filters, each with its individual charge coupled input and differential output amplifiers in a single semiconductor chip together with a CCD multiplexing shift register into which charge packets are introduced in parallel from the respective output amplifiers of the transversal filters.

Embodiments of the invention will be described in greater detail with reference to the accompanying drawings wherein FIG. 1 is a diagrammatic illustration of a CCD transversal filter together with associated input and output amplifiers.

FIG. 2 is a diagrammatic illustration of a charge coupled differential output amplifier embodying the present invention and suitable use in FIG. 1.

FIG. 8 illustrates the manner of charge transfer from an output amplifier to the CCD shift register shown in FIGS. 6 and 7.

Figure 3:
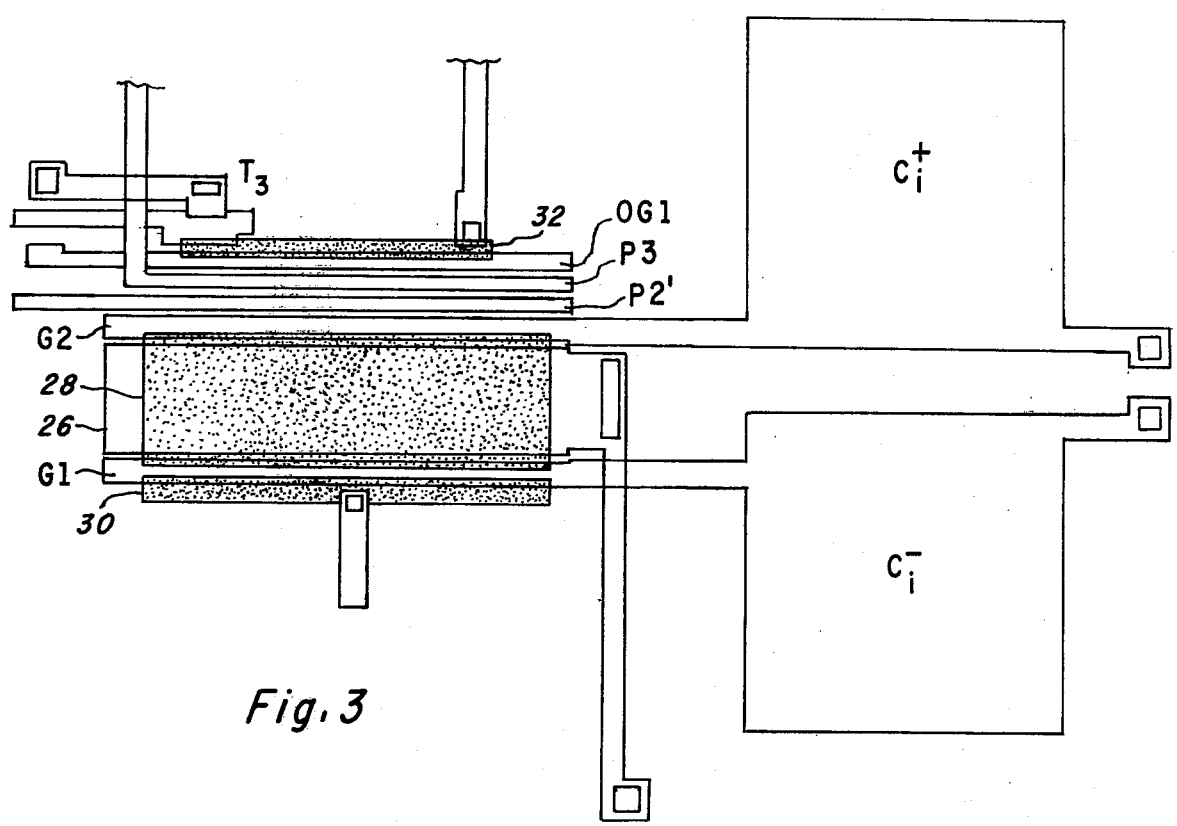
FIG. 3 is a diagrammatic plan view of a CCD differential output amplifier as illustrated by FIG. 2.

FIG. 1 shows in schematic form, a CCD transversal filter. The filter includes a CCD shift register 10, illustrated by way of example as a three-phase shift register, which receives inputs in the form of charge packets from a charge coupled input amplifier 12 to which time samples of analog input signals are applied. The shift register includes charge transfer of phase electrodes $P_1$, $P_2$ and $P_3$ connected to respective clock lines $\phi_1$, $\phi_2$ and $\phi_3$.

The quantity of charge stored in a charge packet in the semiconductor substrate beneath a phase electrode is approximately proportional to the analog signal voltage $V_{in}$ that was sampled at the input of the CCD. By non-destructively sampling the charge packet at each stage of delay, multiplying each sample by a weighting coefficient, and summing the resulting product, the CCD can perform a convolution or filtering operation. The output $V_{out}$ of the device is represented by $$V_{out}(nT_c) = \sum_{m=1}^{N} H_m V_{in}(nT_c - mT_c) \tag{1}$$

where $V_{in}$ represents the sampled input signal, $h_m$ are the weighting coefficients on an n-stage CCD delay line and $T_c$ is the clock pulse period. Proper selection of the weighting coefficients can provide a very wide variety of filtering or correlation functions, including a bandpass characteristic.

A split-electrode tap weighting technique is used to perform the non-destructive sampling of the delay signals and simultaneously to perform the multiplication and summing operations of equation (1). The principle of operation of split-electrode tap weighting is that as charge transfers within the CCD channel into the region under a phase electrode, an opposite charge must flow onto the electrode from the clock line. In the example illustrated by FIG. 1, all the $P_2$ electrodes are split into two sections of varying sizes. One side of each split electrode is connected to the $\phi_2+$ clock lines and the other to the $\phi_2-$ clock line. The $\phi_2+$ and $\phi_2-$ clock lines are clocked simultaneously with the same clock phase $\phi_2$. The signal-dependent charge that flows into each portion of a split electrode is proportional to the area of that part of the electrode and to the signal charge flowing onto that electrode. By measuring the difference in charge the two sections of a split electrode, the non-destructive sampling and weighting operations are performed. Since the $\phi_2+$ electrodes are tied together and the $\phi_2-$ electrodes are tied together, the summation occurs automatically and the output signal at each clock period is proportional to the difference in charge required by the two lines of the split phase. Measurement of the difference in charge in the two sections of the split electrodes is performed by a charge coupled output amplifier 14 the two split-electrode clock lines $\phi_2+$ and $\phi_2-$ are driven by a common driver through series capacitors $C_i+$ and $C_i-$ which integrates the clock line currents. The transistors T1 and T2 connected to those clock lines, are used to erase the memory of each signal charge on the clock lines after the phase voltage $\phi_2$ has been turned off. The difference in the voltages appearing across $C_i+$ and $C_i-$ after each transfer is therefore proportional to that signal charge.

For further details of the manner of construction and operation of CCD transversal filter employing split electrode signal sampling and weighting, reference is made to U.S. Pat. No. 3,819,958 issued June 25, 1974 to W. M. Gosney and assigned to Texas Instruments Incorporated.

FIGS. 2 and 3 illustrate the charge coupled differential amplifier 14 in greater detail. A p-type (n-channel) silicon substrate 20 has a surface overlaid by an insulating layer 22, suitably silicon oxide, on which are located phase electrodes $P_2'$ and $P_3$ beneath which a signal propagation channel is defined in the substrate 20, for example, by known channel stop techniques. The phase electrodes $P_2'$ and $P_3$ are not essential and may be omitted. At the input end of the channel 24, are located a spaced-apart pair of gate electrodes G1 and G2 disposed on the insulating layer 22. Between the gate electrodes G1 and G2 is located a grounded electrode 26 beneath which is an $n+$ doped region 28 in the substrate 20. However, the doped region 28 could be omitted and a suitably high positive bias applied to the electrode 26 to provide a metal-oxide capacitor. The gate electrode G1 is located between the doped region 28 and an $n+$ input diode region 30 defining a minority charge carrier source. At the output end of the channel 24 a d.c. biased (e.g. 2-4v) output gate OG is located between the phase electrode $P_3$ and an $n+$ output diode region 32 in the substrate.

The structure described is in effect a single cell three phase CCD structure.

For operation of the output amplifier in conjunction with the transversal filter shown in FIG. 1, the gates G1 and G2 are connected respectively to the split electrode clock phase lines $\phi_2-$ and $\phi_2+$, the gate G2 being d.c. biased to a more positive level than the gate G1 using a source follower SF3 to gate transistors T5 and T6, the source follower SF3 being gated by $\overline{\phi_2}$. Typical bias values for gates G1 and G2 and 4.5v and 5v respectively. Instead of using an external bias source, an ion implanted layer may be formed beneath gate G2 (n-type) or gate G1 (p-type) to provide a layer of immobile charge at the semiconductor insulator interface, positive beneath G2 or negative beneath G1.

Figure 4:
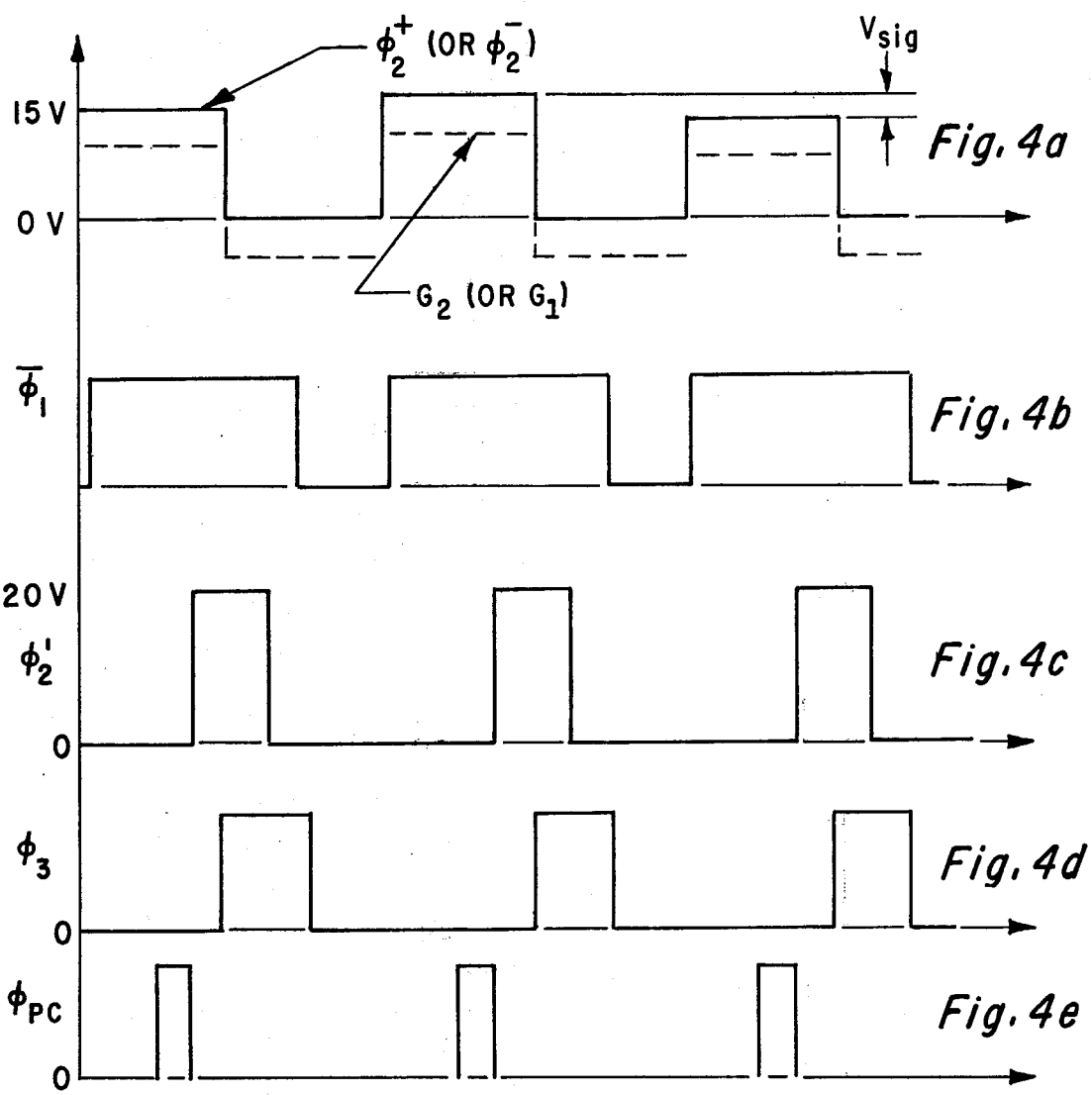
FIGS. 4a–4e show clock pulse diagrams illustrative of the manner of operation of the amplifier shown in FIGS. 2 and 3.

At $t_o$ the beginning of an operating cycle of the output amplifier, the input diode 30 is at a high positive potential. When charge transfers under the $\phi_2+$ and $\phi_2-$ electrodes of the CCD filter 10, the differential output signal appears across the gates G2 and G1 superposed on the $\phi_2$ clock voltage (FIG. 4a). The input diode is pulsed by $\phi_1$ to a low potential and then returned to its initial state. While the $\phi_2$ clock is turned on and the potential on $\phi_2'$ is off, the signal voltages are applied to the gates G1 and G2. The $\phi_1$ clock pulse is inverted by the IGFET inverter INV and pulses the input diode 30 to a low potential as shown in FIG. 4b, placing charge on the capacitor C1 defined by gate electrode G2 in conjunction with the underlying regions of insulating layer 22 and substrate 20, and the capacitor c2 defined by the doped region 28 in conjunction with the overlying electrode 26. The capacitance of c2 is substantially greater than c1. Capacitors c1 plus c2 are defined as the input capacitance $c_{in}$ of amplifier 14. The subsequent rise of the input diode voltage removes charge from the capacitor $c_{in}$ over the region beneath gate G1 until the semiconductor surface potential reaches the threshold set by the voltage on the gate G1 i.e. $V_{G1} - V_{T1}$ where $V_{T1}$ is the threshold voltage of the gate G1. When the clock pulse $\phi_2'$ turns on, more charge is removed from the capacitor $c_{in}$ into the potential well created beneath the $P_2'$ electrode, charge being removed until the surface potential rises to the threshold level set by the voltage on gate G2 i.e. $V_{G2} - V_{T2}$. The amount of charge injected into the potential well beneath the phase electrode $P_2'$ is given by $$Q = c_{in}[(V_{G2} - V_{T1}) - (V_{G1} - V_{T2})] \qquad (2)$$

since $V_{T1} = V_{T2}$ $$Q = c_{in}(V_{G2} - V_{G1})$$

When the phase voltage $\phi_3$ turns on, the charge packet is transferred from beneath the $P_2'$ electrode to beneath the $P_3$ electrode and finally beneath the output gate OG to the output diode 32 which is precharged during $\phi_2'$ to a suitable positive potential over the IGFET T3. An IGFET source follower SF1 and an IGFET sample-and-hold circuit SH then provide a final output signal voltage.

The output diode region 32 defines a capacitance C3. The output voltage, $V_{out}$, from the source follower SF is $$V_{out} = (Q_{in}/C_3)(V_{G2} - V_{G1}).$$

The capacitance $C_{in}$ is selected to be significantly greater than the capacitance C3 so that the output voltage $V_{out}$ is an amplified version of the differential input voltage $V_{G2} - V_{G1}$. Typically, a ratio of $C_{in}/C3$ to provide a gain of approximately ten may be used.

In a particular example of the output amplifier which has been fabricated and tested, the maximum swing between the voltages applied to the gates G1 and G2 is about 1 volt. These voltage changes are small relative to the back gate bias (suitably approximately $-15$ volts) applied to the semiconductor substrate 20 which minimizes changes in the threshold voltage levels due to changes in the depletion charge under the gates. Furthermore, use of a high resistivity semiconductor substrate reduces depletion charge effects.

The gate electrodes G2 and G1 are operated with a d.c. offset so that for equal input voltages on the gates G1 and G2 (i.e. in the absence of any differential input signal) a charge packet equal to 50% of the charge capacity of the amplifier is injected. The amplitude of the clock wave form $\phi_2'$ is a few volts greater than the $\phi_2$ pulses applied to the CCD filter 10. In a particular example, the $\phi_2$ pulses were 14 volts and the $\phi_2'$ pulses were 20 volts.

Figure 5:
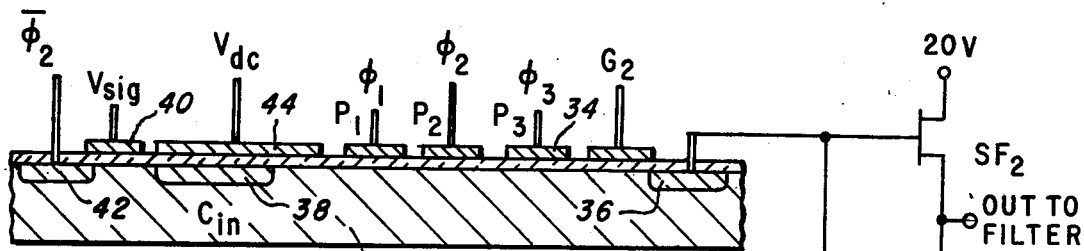
FIG. 5 is a diagrammatic illustration of a charge coupled input amplifier suitable for use in FIG. 1.

The charge coupled input amplifier is illustrated by FIG. 5. The amplifier is formed as part of the semiconductor substrate 20 and includes phase electrodes $P_1$, $P_2$ and $P_3$ on the insulating layer 22, a signal propagation channel 34 being defined in the semiconductor substrate beneath those phase electrodes. At the output end of the channel 34 a d.c. biased output gate OG2 is located on the insulating layer 22 between the phase electrode $P_3$ and an $n+$ output diode region 36 in the substrate 20. The output diode region 36 is connected to the input of a source follower amplifier SF2. At the input end of the channel 34, an $n+$ capacitor diode region 38 is located in the substrate between the phase electrode $P_1$ and a signal input electrode 40 which itself is located between the $n+$ region 38 and a further $n+$ region 42 which provides a source of minority charge carriers. An electrode 44 is located on the insulating layer 22 above the $n+$ region 38. The doped regions 38 and 36 define capacitors $C_{in}$ and $C_{out}$ respectively.

The operation of the charge coupled input amplifier 12 is as follows. The diode region 42 initially is pulsed to a low potential by $\overline{\phi}_2$ placing charge on the capacitor $C_{in}$. Subsequent rise of the diode voltage removes charge from C1 over the gate 40 until the surface potential reaches the value $V_{sig} - V_T$, where $V_{sig}$ is the analog signal sample voltage applied to the electrode 40 during clock pulse period $\phi_3$. During the next $\phi_1$ pulse, the signal amplitude determined charge stored on capacitor $C_{in}$ is transferred into the potential well defined beneath the $P_1$ electrode and then propagated along the channel 34 by the $\phi_2$ and $\phi_3$ pulses applied to electrodes $P_2$ and $P_3$, being transferred under the output gate OG2, into the output diode region 36 which has been precharged to a suitable reference potential over transistor T4 gated by a $\phi_{PC}$ pulse (FIG. 4e). The capacitor $C_{out}$ is thus charged and applies an input voltage to the source follower amplifier SF2, the output of which provides the input voltage $V_{in}$ to the filter 10.

Figure 6:
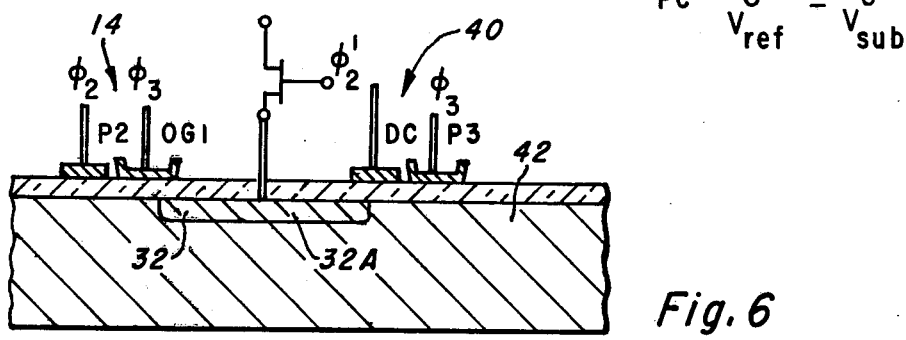
FIGS. 6 and 7 are diagrammatic sectional and plan illustrations of a CCD shift register for multiplexing outputs from a charge coupled differential amplifier according to the invention.
Figure 7:
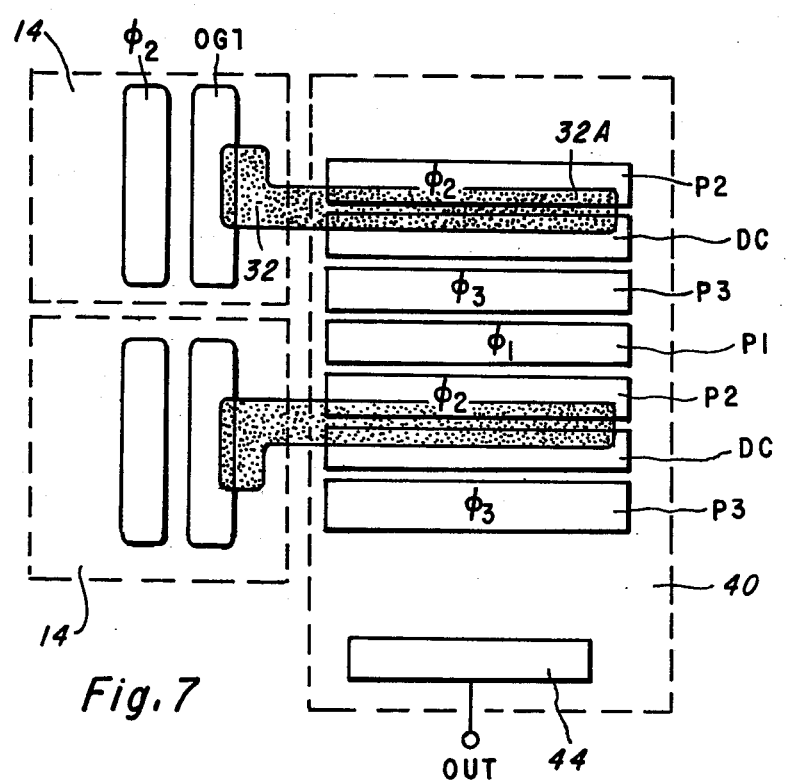

FIGS. 6 and 7 illustrate a structure wherein a plurality of charge coupled amplifiers as shown in FIG. 2 may be used to feed input signals in parallel into a serial charge coupled device shift register in order to multiplex such signals.

The serial shift register 40 is illustrated as a three-phase shift register having charge transfer or phase electrodes $P_1$, $P_2$, $P_3$. A signal propagation channel 42 is defined beneath the phase electrodes and is terminated by an output diode 44. The $n+$ output diode 32 of each charge coupled amplifier 14 is L-shaped with one arm 32A extending across the propagation channel 42, the charge coupled amplifiers and the shift register 40 all being formed as part of the same semiconductor chip. It is to be noted that the output gate OG1 of the amplifiers 14 are clocked by $\phi_3$ and not d.c. biased.

On the downstream side of signal flow in the propagation channel 42, designated by an arrow in FIG. 7, a d.c. bias electrode DC overlaps the diode region 32A while on the upstream side it is overlapped by a $P_2$ electrode. Charge from the output diode region 32A is transferred beneath the biased electrode 44 into the serial shift register 40 during a clock pulse $\phi_3$. This charge transfer operation is illustrated by FIG. 8 and is described in greater detail in co-pending U.S. patent application Ser. No. 645,774, filed Dec. 31, 1975 by Robert W. Brodersen and assigned to the assignee of the present application (TI-5855). The charges inputted in parallel into the shift register 40 are then propagated along the channel 42 by clock pulses $\phi_1$, $\phi_2$ and $\phi_3$ applied to electrodes $P_1$, $P_2$ and $P_3$ and appear as a multiplexed stream of charge packets at the output diode 44. The clock pulses used for operating the amplifiers 14 and the shift register 40 may be of the same frequency; alternatively, a higher clock pulse rate may be used to operate the shift register 40 provided that there is sufficient overlap between the $\phi_3$ pulses of both systems to ensure transfer from the output diodes of the amplifiers 14 into the shift register 40.

The shift register 40 also may have a narrower channel width than that of the amplifiers 14 to provide further voltage gain.

In a particular application, the amplifiers 14 shown in FIGS. 6 and 7 are output amplifiers of transversal filters such as described with reference to FIG. 1. However, the amplifiers 14 could readily be used to receive differential input signals from other sources.

Figure 9:
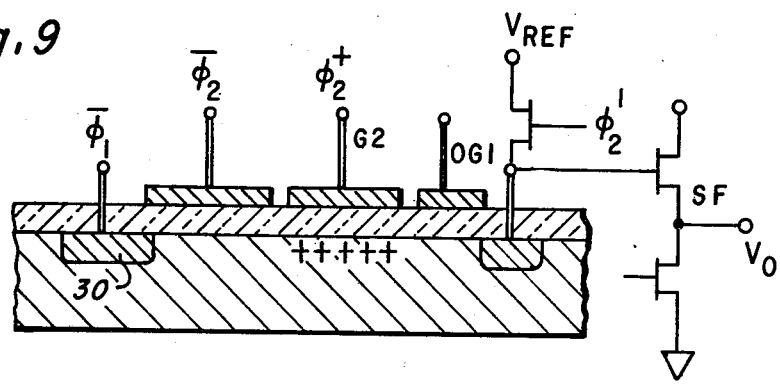
FIGS. 9 and 10 illustrate further charge coupled differential amplifiers embodying the invention.

FIG. 9 shows an alternative form of the output amplifier 14 which dispenses with use of the diode region 28 as well as with the phase electrodes $P_2$ and $P_3$. In FIG. 9, the gate G2 is increased in area in order to increase the capacitance $C_{G2}$ defined by that gate in conjunction with the underlying insulating layer and semiconductor substrate regions, which functions in place of the diode capacitance c2 in FIG. 2. In addition, in FIG. 9 the gate G2 is immediately followed by the output gate OG1 which is d.c. biased e.g. at about 2-4v, the output diode region 32 being precharged during a $\phi_2$ pulse.

The required d.c. offset bias between the gates G1 and G2 is obtained by an n-type implanted layer 50 beneath the gate G2 which provides an immobile layer of positive charge at the semiconductor/insulator interface. Alternatively, a p-type implanted layer may be located beneath the gate G1 to provide an immobile layer of negative charge. The amplifier gain of the structure shown in FIG. 9 is given by $C_{G2}/C_{out}$. Operation of the structure is otherwise as described with reference to FIG. 2.

Figure 10:
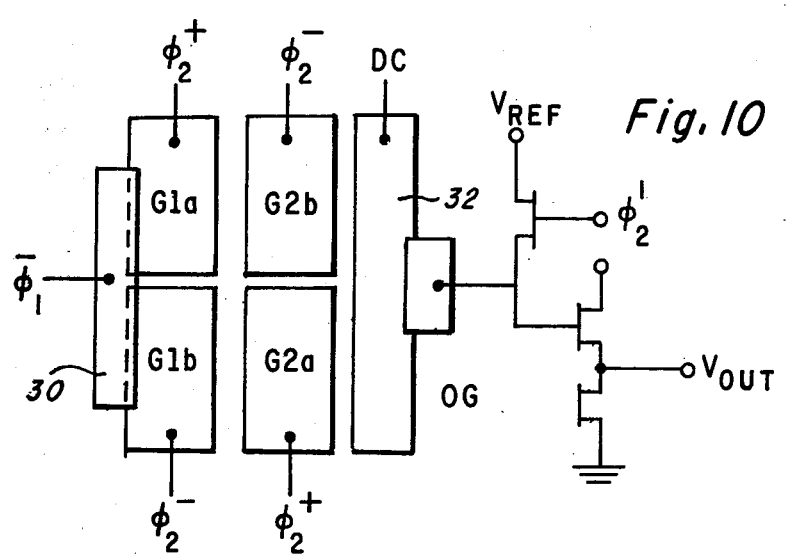

Yet a further modification of the output amplifier structure is shown in FIG. 10, wherein the gates G1 and G2 are split into identical area portions G1a, G1b and G2a, G2b respectively. Each gate, in conjunction with the underlying insulator and semiconductor regions defines a predetermined capacitance $C_{in}$. This structure provides an output voltage dependent upon the magnitude of the difference between two signal imput voltages, regardless of which is the greater. The gates G1a and G2b are connected to receive inputs from the lines $\phi_2+$ of FIG. 1 while the gates G1b and G2a are connected to receive inputs from the $\phi_2-$ lines. When $V_{\phi2+}$ is greater than $V_{\phi2-}$, signal charge is injected only beneath the gates G1b, G2b whereas when $V_{\phi2-}$ is greater than $V_{\phi2+}$, signal charge is injected only beneath the gates G1a, G2a. The output voltage $V_{out}$ from the output diode 32 therefore is proportional to $$C_{in}/C_{out} \mid V_{\phi2+} - V_{\phi2-} \mid ,$$

where $C_{out}$ is the output diode capacitance and $C_{in}$ $C_{out}$. In this structure, no implanted layers beneath G1 or G2 nor any d.c. offset between those is required.

Figure 11:
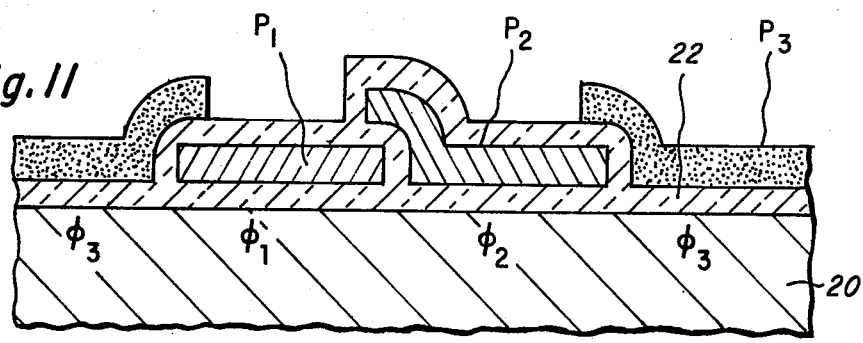
FIG. 11 is a scrap cross sectional view illustrating a CCD phase electrode structure.
Figure 12:
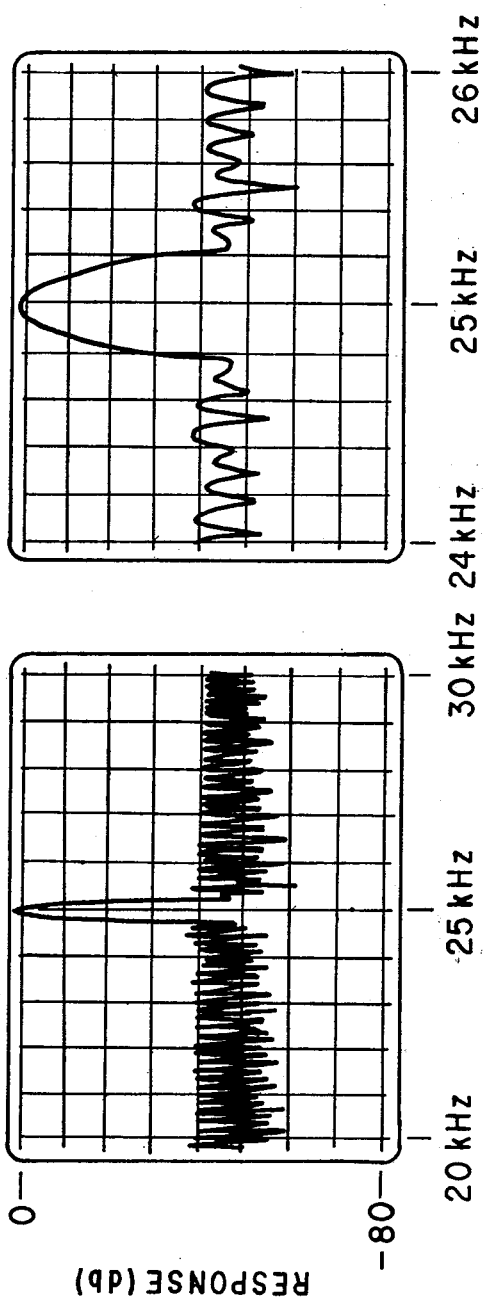
FIGS. 12 and 13 are waveforms illustrative of operation of a CCD bandpass filter as described with reference to FIGS. 1-5.
Figure 13:
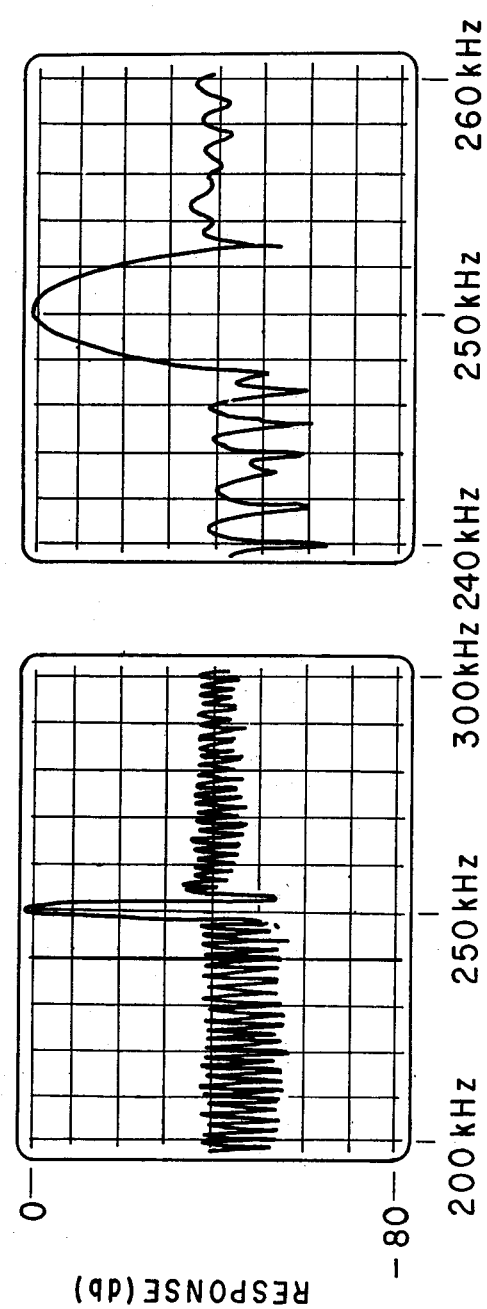

An 800 stage bandpass filter as described with reference to FIG. 1 and including charge coupled input and output amplifiers as described with reference to FIGS. 2-5 has been constructed as a single chip structure. A 40-70 ohm-cm p-type silicon substrate was used with a gate oxide thickness of 1500A. The electrode structure is illustrated by FIG. 11 and uses two levels of polysilicon electrodes $P_1$, $P_2$ and one aluminum electrode level $P_3$. Each clock phase is on a separate metalization level thereby simplifying fabrication. The input and output amplifiers each had measured voltage gains of approximately 9 at both $f_c$(clock frequency) = 100kHz and $f_c =$ 1mHz. The frequency response of the filter at clock frequencies of 100kHz and 1mHz are illustrated by FIGS. 12 and 13.

What is claimed is:

1. A charge coupled device transversal filter comprising:
   a. a semiconductor substrate having an insulating layer on one surface thereof;
   b. charge carrier source means in said substrate for injecting signal charge packets into said substrate in response to a sampled analog voltage signal $v_{in}(nTc)$ where Tc is the sampling period;
   c. a plurality of charge transfer electrode means on said insulating layer and overlying a signal propagation channel defined in said substrate for propagating said signal charge packets down said channel in response to clock signals applied thereto, said electrode means including N split electrodes having first and second sections over preselected portions of said channel, each of said split electrodes defining a weighting coefficient hm;
   d. a second charge carrier source in said substrate;
   e. first and second gate electrodes on said insulating layer and spaced apart from each other, said first gate electrode lying over a substrate region adjacent to said second charge carrier source;
   f. coupling means electrically coupling said first gate electrode to said first sections of said split electrodes, and coupling said second gate electrode to said second sections of said split electrodes;
   g. a storage electrode on said insulating layer between said first and second gate electrodes;
   h. clock means for selectively applying clock pulses to said second charge carrier source and said first and second gate electrodes to inject convolution charge packets proportional to $$\sum_{m=1}^{N} v_{in}(nTc - mTc)hm$$

into said substrate under said second gate electrode and said storage gate electrode.

2. A transversal filter according to claim 1 and further including capacitive means $C_i^-$ and $C_i^+$ serially coupled to said first and second gate electrodes respectively for integrating currents induced thereon by said split electrodes through said coupling means.

3. A transversal filter according to claim 1 and further including a plurality of transfer electrode means serially disposed on said insulating layer for propagating said convolution charge packets away from said second gate electrode and said storage gate electrode.

4. A transversal filter according to claim 1, and further including a doped region within said semiconductor substrate near said one surface under said storage gate electrode.

5. A transversal filter according to claim 1, and further including a layer of immobile charge on said first surface of said semiconductor substrate under said first gate electrode, said immobile charge being of the same polarity as said signal charge packets.

6. A transversal filter according to claim 1, and further including a layer of immobile charge on said first surface of said semiconductor substrate under said second gate electrode, said immobile charge having a polarity opposite the polarity of said signal charge packets.

7. A transversal filter according to claim 1, and further including means for applying an offset voltage to said first and said second gate electrodes.

8. A charge coupled device transversal filter comprising:
   a. a semiconductor substrate having an insulating layer on one surface thereof;
   b. charge carrier source means in said substrate for injecting signal charge packets into said substrate in response to a sampled analog voltage signal $v_{in}(nTc)$ where Tc is the sampling period,
   c. a plurality of charge transfer electrode means on said insulating layer and overlying a signal propagation channel defined in said substrate for propagating said signal charge packets down said channel in response to clock signals applied thereto, said electrode means including N split electrodes having first and second sections over preselected portions of said channel, each of said split electrodes defining a weighting coefficient $hm$;

d. a second charge carrier source in said substrate;

e. first and second gate electrodes on said insulating layer and spaced apart from each other, said first gate electrode lying over a substrate region adjacent to said second charge carrier source;

f. coupling means electrically coupling said first gate electrode to all of said first sections of said split electrodes, and coupling said second gate electrode to all of said second sections of said split electrodes;

g. a doped region in said substrate located between said first and second gate electrodes;

h. clock means for selectively applying clock pulses to said second charge carrier source and said first and second gate electrodes to inject convolution charge packets proportional to $$\sum_{m=1}^{N} v_{in}(nTc-mTc)hm$$

into said doped region and said substrate under said second gate electrode.

9. A transversal filter according to claim 8, and further including capacitive means $C_i^-$ and $C_i^+$ serially coupled to said first and second gate electrodes respectively for integrating currents induced thereon by said split electrodes through said coupling means.

10. A transversal filter according to claim 8, and further including a plurality of transfer electrode means serially disposed on said insulating layer for propagating said convolution charge packets away from said second gate electrode and said storage gate electrode.

11. A charge coupled device transversal filter comprising:

a. a semiconductor substrate having an insulating layer on one surface thereof;

b. charge carrier source means in said substrate for injecting signal charge packets into said substrate in response to a sampled analog voltage signal $v_{in}(nTc)$ where $Tc$ is the sampling period;

c. a plurality of charge transfer electrode means on said insulating layer and overlying a signal propagation channel defined in said substrate for propagating said signal charge packets down said channel in response to clock signals applied thereto, said electrode means including N split electrodes having first and second sections over preselected portions of said channel, each of said split electrodes defining a weighting coefficient $hm$;

d. a second charge carrier source in said substrate;

e. first and second gate electrodes serially disposed on said insulating layer, said first gate electrode lying over a substrate region adjacent to said second charge carrier source;

f. coupling means electrically coupling said first gate electrode to said first sections of said split electrodes, and coupling said second gate electrode to said second sections of said split electrodes;

g. clock means for selectively applying clock pulses to said second charge carrier source and said first and second gate electrodes to inject convolution charge packets proportional to $$\sum_{m=1}^{N} v_{in}(nTc-mTc)hm$$

into said substrate under said second gate electrode.

12. A transversal filter according to claim 11 and further including capacitive means $C_i^-$ and $C_i^+$ serially coupled to said first and second gate electrodes respectively for integrating currents induced thereon by said split electrodes through said coupling means.

13. A transversal filter according to claim 11 and further including a plurality of transfer electrode means serially disposed on said insulating layer for propagating said convolution charge packets away from said second gate electrode and said storage gate electrode.

14. A charge coupled device transversal filter comprising:

a. a semiconductor substrate having an insulating layer on one surface thereof;

b. charge carrier source means in said substrate for injecting signal charge packets into said substrate in response to a sampled analog voltage signal $v_{in}(nTc)$ where $Tc$ is the sampling period;

c. a plurality of charge transfer electrode means on said insulating layer and overlying a signal propagation channel defined in said substrate for propagating said signal charge packets down said channel in response to clock signals applied thereto, said electrode means including N split transfer electrodes having first and second sections over preselected portions of said channel, each of said split electrodes defining a weighting coefficient $hm$;

d. a second charge carrier source in said substrate;

e. first and second split gate electrodes serially disposed on said insulating layer, said first split gate electrode lying over a substrate region adjacent to said second charge carrier source, each of said split gate electrodes having first and second sections;

f. coupling means electrically coupling said first section of said first split gate electrode to said second section of said second split gate electrode and to said first sections of all of said split transfer electrodes, and coupling said second section of said first gate electrode to said first section of said second gate electrode and to said second sections of all of said split transfer electrodes;

g. clock means for selectively applying clock pulses to said second charge carrier source and said first and second gate electrodes to inject convolution charge packets proportional to $$\sum_{m=1}^{N} v_{in}(nTc-mTc)hm$$

into said substrate under one of the sections of said second gate electrode.

15. A transversal filter according to claim 14 and further including capacitive means $C_i^-$ and $C_i^+$ serially coupled to said first section and second section of said second gate electrode respectively for integrating currents induced thereon by said split electrodes through said coupling means.

* * * * *